United States Patent [19]

Moroboshi et al.

[11] Patent Number: 4,601,922
[45] Date of Patent: Jul. 22, 1986

[54] METHOD OF FORMING A LAYER OF THIN FILM ON A SUBSTRATE HAVING A MULTIPLICITY OF MESH-LIKE HOLES

[75] Inventors: Yasuo Moroboshi; Akira Nishiwaki, both of Hachioji, Japan

[73] Assignee: Konishiroku Photo Industry Co., Ltd., Tokyo, Japan

[21] Appl. No.: 649,858

[22] Filed: Sep. 12, 1984

[30] Foreign Application Priority Data

| Sep. 21, 1983 | [JP] | Japan | 58-174769 |
| Sep. 21, 1983 | [JP] | Japan | 58-174770 |
| Sep. 21, 1983 | [JP] | Japan | 58-174771 |
| Sep. 21, 1983 | [JP] | Japan | 58-174772 |
| Sep. 21, 1983 | [JP] | Japan | 58-174773 |
| Sep. 21, 1983 | [JP] | Japan | 58-174774 |

[51] Int. Cl.$^4$ ............................................. C23C 16/00
[52] U.S. Cl. ........................... 427/248.1; 427/124; 427/250
[58] Field of Search ................. 427/250, 255.5, 248.1, 427/124, 144

[56] References Cited

U.S. PATENT DOCUMENTS

| 2,676,114 | 4/1954 | Barkley | 427/250 |
| 2,971,862 | 2/1961 | Baer et al. | 427/250 |
| 3,520,716 | 7/1970 | Okamoto et al. | 427/250 |
| 4,098,919 | 7/1978 | Morimoto et al. | 427/250 |
| 4,344,988 | 8/1982 | Sono et al. | 427/255.5 |
| 4,354,909 | 10/1982 | Takagi et al. | 427/250 |
| 4,374,162 | 2/1983 | Takagi | 427/250 |
| 4,394,210 | 7/1983 | Morimoto et al. | 427/250 |
| 4,477,488 | 10/1984 | Sugita et al. | 427/255.7 |

FOREIGN PATENT DOCUMENTS

| 2402685 | 7/1975 | Fed. Rep. of Germany | 427/250 |
| 57-189342 | 11/1982 | Japan | 427/250 |

Primary Examiner—Sadie L. Childs
Attorney, Agent, or Firm—Jordan B. Bierman

[57] ABSTRACT

A method of forming a thin layer on a substrate by vapor deposition wherein particles of the material to be constituted the thin layer are caused to fly in such a direction that they reach the surface of the substrate at substantially a right angle relative to the latter. The substrate is located opposite to a particle generating source. A shield device with a slit is provided in the proximity of the substrate located opposite to the particle generating source and between the substrate and the particle generating source so that they are introduced onto the surface of the substrate through the slit at substantially a right angle relative to the surface of the substrate.

9 Claims, 18 Drawing Figures

F I G. 1
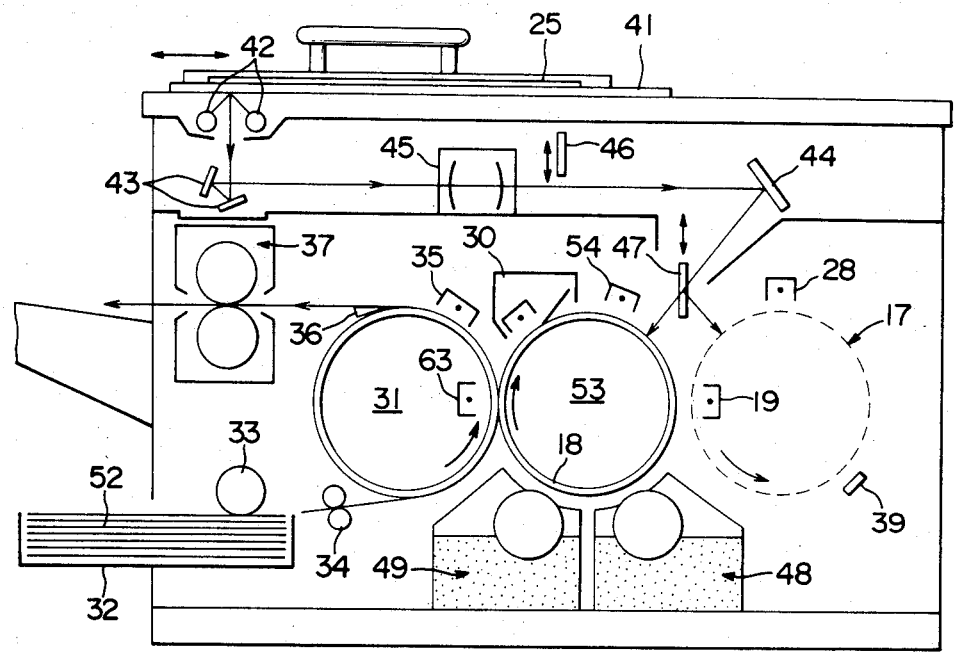
F I G. 2
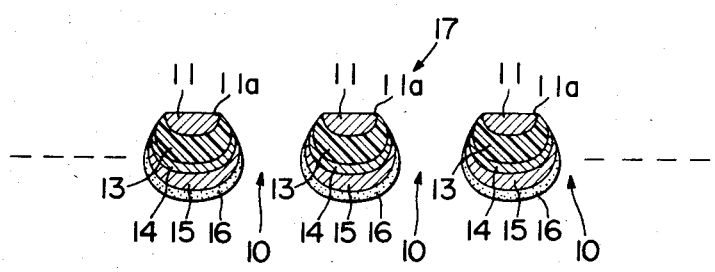

METHOD OF FORMING A LAYER OF THIN FILM ON A SUBSTRATE HAVING A MULTIPLICITY OF MESH-LIKE HOLES

BACKGROUND OF THE INVENTION

1. Field of the Invention

The present invention relates to a method of forming a layer of thin film.

2. Description of the Prior Art

A hitherto known multi-color electrophotographic copying machine is typically constructed such that an electrostatically charged image is formed on a photosensitive screen with a large number of pores (preferably mesh-shaped pores) formed thereon, and it is then transferred onto an electrically chargeable layer (for instance, a photosensitive layer on a photosensitive drum) while a stream of ion beams (for instance, plus ion particles) is properly controlled.

FIG. 1 schematically illustrates a conventional two-color electrophotographic copying machine for reproducing a two-colored image on an original including a black colored image area and a red colored image area on the white paper surface. The illustrated machine includes a reciprocable original holding board 41 at the upper end part thereof and an original on the original holding board 41 is exposed to a light beam emitted from lighting lamps 42. Reference numerals 43 and 44 each designate a mirror, respectively, reference numeral 45 a stationary lens, reference numeral 46 a movable red filter adapted to protrude into and retract from the passage of a light beam and reference numeral 47 a movable dichroic filter adapted to protrude into and retract from the passage of a light beam. The dichroic filter 47 reflects red colored light therefrom but allows cyan colored light complementary to red colored light to pass therethrough. FIG. 1 illustrates the working condition of the machine in which the red color filter 46 is retracted from the passage of a light beam and the dichroic filter 47 is protruded into the passage of the light beam. A photosensitive body 53 in the form of a drum has a photosensitive layer 18 formed over its peripheral surface and the photosensitive layer 18 is uniformly charged by a corona charger 24 as the photosensitive body 53 is rotated in the clockwise direction. The photosensitive layer 18 is made of selen, organic semiconductor or like material.

In the proximity of the photosensitive body 53 are arranged a charger 54 for uniformly charging the photosensitive layer 18, a black color developing device 48 containing therein plus charged black toner, a red color developing device 49 containing therein plus charged red toner and a cleaning device 30 for removing residual toner and electric charge on the photosensitive layer 18. Reference numeral 31 designates a transferring drum having the same diameter as that of the photosensitive body 53. The transferring drum 31 rotates in operative association with the photosensitive body 53 while coming into rolling contact with the photosensitive layer 18 of the latter, or is rotated in the anti-clockwise direction. Reference numeral 63 designates a corona discharger or transferring electrode, reference numeral 32 a feed paper tray on which a number of papers to be electrophotographically copied are placed one above another, reference numeral 33 a paper feed roller for feeding copying papers 52 in the feed paper tray 32 one by one, reference numeral 34 a first pair of conveying rollers for conveying copying papers toward the transferring drum 31, reference numeral 35 an electrostatic separator for discharging electric charge after completion of electrophotographic copying operation to facilitate separation of copying paper from the transferring drum 31 and reference numeral 36 a separating pawl for forcibly separating copying paper from the transferring drum 31. Further, reference numeral 37 designates a fixing device with a heater incorporated therein. It should be noted that in practice a guide plate is provided in the machine but it is not shown in the drawing for the purpose of simplification of illustration.

On the other hand, a cylindrical photosensitive screen drum 17 is disposed at a position located outwardly of the photosensitive layer 18 in such a manner that its photoconductive layer is located opposite to the photosensitive layer 18. The screen drum 17 is arranged so as to rotate in the anti-clockwise direction in synchronization with the original holding board 41 and the photosensitive layer 18. Further, in the proximity of the screen drum 17 are arranged a screen charger 28, a screen discharger 39 comprising an electroluminescence plate or alternate current corona discharger to remove residual electric charge on the screen drum 17 and an electrically charged particle source 19 (corona discharger) disposed inside the screen drum 17 at a position opposite to the photosensitive body 53 to emit electrically charged particles therefrom.

As is apparent from FIG. 2, the photosensitive screen drum 17 has a large number of very fine pores 10 formed thereon and comprises a drum-shaped electroconductive screen base 11, one surface of which is exposed to the outside, an electric insulating layer 13 disposed at least on the other surface of the electroconductive screen base 11 (and on the wall surface of the pore 10 in the illustrated case), an electroconductive film 14 made of aluminum or like material disposed on the electric insulating layer 13 for the purpose of biasing, a photoconductive (photosensitive) layer 15 and an electric charge transporting layer 16. Specifically, the photoconductive screen base 11 is made of mesh of metallic material such as stainless steel, aluminum or the like material, the electric insulating layer 13 is made of polyethylene or like material and both the photosensitive layer 15 and the electric charge transporting layer 16 are made of organic semiconductor.

When the photosensitive screen 17 is made, the photoconductive layer 14 constituting the screen 17 is formed by using an aluminum vaporizing source 20 from which aluminum vapor is produced, as illustrated in FIG. 3. It should be noted that some part of the aluminum vapor 21 coming up from the vaporizing source 20 as identified by reference numeral 21' flows upwardly at a certain inclination angle relative to the screen base 11 in the direction as identified by arrow marks in the drawing with the result that it tends to pass through the pores 10 to reach the reverse side of the screen base 11 as seen from the vaporizing source 20 or it is deposited directly on the reverse side of the screen base 11. This causes the photoconductive layer 14 to be in electric communication with the screen base 11 (in the form of short circuit) via the aluminum part thus deposited on the reverse side of the screen base 11 as illustrated in FIG. 4, resulting in the photoconductive layer 14 failing to function properly. In view of the malfunction described above there has been hitherto proposed a countermeasure that a comparatively thin part 14a of the aluminum film 14 deposited on the screen base 11 (in particular, a thin part deposited on the edge portion 11a of the screen base 11) is removed by burning it with the use of electric current so as to assure that any short circuit to the screen base 11 is not formed. This leads to problems, however, in that an extra step for removing the thin part as mentioned above is required, the aluminum film 14 is damaged to some extent by the burning operation and the withstand voltage ability of the aluminum film 14 is reduced.

SUMMARY OF THE INVENTION

The present invention has hence been made with the foregoing problems in mind.

It is an object of the present invention to provide a method of forming a thin layer such as electroconductive film or the like.

It is another object of the present invention to provide a method of forming a layer of thin film on a substrate which is characterized in that a large number of particles of material (for instance, aluminum) constituting the thin film are caused to fly toward the substrate at substantially a right angle relative to the latter, wherein the object is located opposite to a particle generating source which generates the particles. It should be noted that the term "substantially a right angle" represents not only the case where the particles reach the surface of the object at an exactly right angle relative to the latter but also the case where they reach it at a slight inclination angle relative to the vertical plane without any of the particles arriving at the rear side of the substrate.

An apparatus for satisfactorily carrying out the method of the invention as described above is characterized in that shield means with a slit formed thereon is disposed at a position in the proximity of an object located opposite to a particle generating source, between the object and the particle generating source, so that only a portion of the particles adapted to fly in the substantially vertical direction are introduced onto the surface of the object through the slit.

According to the invention, particles of material constituting the thin film structure are introduced onto the surface of an object only in such a direction that they reach the surface of the object at substantially a right angle relative to the latter. Thus, particles are deposited on the surface of the object one above another without any particles reaching the rear side of the object or direct deposition on the rear surface of the object occurring. Accordingly, a layer of thin film thus obtained can be delivered to a next step (for instance, a step of forming a photosensitive layer) without any necessity for additionally processing the thin film structure.

Another apparatus for forming a layer of thin film in which a large number of particles of material constituting the thin film structure (for instance, aluminum) are caused to fly toward an object located opposite to a particle generating source so as to allow them to be deposited on the surface of the object, is characterized in that the particles are introduced onto the surface of the object through a slit-shaped particle passage opening located in the proximity of the object, the slit-shaped particle passsage opening serving as control means for controlling the stream of particles and in that the width of the slit-shaped particle passage opening is determined to be as narrow as possible.

According to the invention, particles of material constituting the thin film structure are introduced onto the surface of an object while the stream of particles is controlled with the aid of a particle stream control means. Thus, particles are deposited on the surface of the object one above another without any particles reaching the rear side of the object or dirrect deposition on the rear surface of the object occurring. Accordingly, a layer of thin film thus obtained can be delivered to a next step (for instance, a step of forming a photosensitive layer) without any necessity for additionally processing the thin film structure. Since the width of the slit through which the particles fly is determined to be as narrow as possible, the width of dispersion of particles in the transverse direction above the slit which serves as the particle stream control means can be minimized whereby the particles are deposited on the surface of the object within a predetermined area.

It is still another object of the present invention to provide a method of forming a layer of thin film by way of the steps of allowing a large number of particles of material constituting the thin film structure (for instance, aluminum) to fly toward an object located opposite to a particle generating source and depositing them on the surface of the object, characterized in that the particles are introduced onto the surface of the object through a particle passage opening located in the proximity of the object, the particle passage opening serving as control means for controlling the stream of particles and in that the distance which they fly per unit of time is determined to be as short as possible.

According to the invention, particles of material constituting the thin film structure are introduced onto the surface of an object while the stream of particles is controlled with the aid of the particle stream control means. Thus, particles are deposited on the surface of the object one above another without any particles reaching the rear side of the object or direct deposition on the rear surface of the object occurring. Accordingly, a layer of thin film thus obtained can be delivered to a next step (for instance, a step of forming a photosensitive layer) without any necessity for additionally processing the thin film structure. Since the distance which the particles fly (particularly relating to vaporizing speed) is determined to be as short as possible, the width of dispersion of particles in the transverse direction above the particle passage opening which serves as the particle stream control means can be minimized whereby particles are deposited on the surface of the object within a predetermined area.

A further apparatus for forming a layer of thin film in which a large number of particles of material constituting the thin film (for instance, aluminum, electric insulating material or the like) are caused to fly toward an object located opposite to a particle generating source so as to allow them to be deposited on the surface of the object, is characterized in that removal means (for instance, a mandrel to be described later) is provided for removing any layer of particle deposition formed on the rear side of the object as seen from the particle generating source (for instance, vapor source, spray nozzle or the like) to which a large number of particles are caused to fly.

According to the invention, particle deposition removing means is provided on the rear side of the object so that particles which fly on the rear side of the object (inclusive particles which arrive at the rear side of the object to be deposited thereon) are effectively inhibited from being deposited directly on the rear surface of the object.

It is a further object of the present invention to provide a method of forming a layer of thin film by way of the steps of allowing a large number of particles of material constituting the thin film structure (for instance, aluminum) to fly toward an object located opposite to a particle generating source and depositing them on the surface of the object, characterized in that movement of the particles is kept in a substantially parallel stream by controlling the distance between the particle generating source and the object.

According to the invention particles of material constituting the thin film structure are introduced onto the surface of an object while movement of the particles is kept in a substantially parallel stream. Thus, the particles are deposited on the surface of the object one above another with a fixed direction maintained relative to the latter whereby possible arrival of some part of particles at the rear side of the object is reduced remarkably. Accordingly, a layer of thin film thus obtained can be delivered to a next step (for instance, a step of forming a photosensitive layer) without any necessity for additionally processing the thin film structure.

It is further another object of the present invention to provide a method of forming a layer of thin film by way of the steps of allowing a large number of particles of material constituting the thin film structure (for instance, aluminum) to fly toward an object having a narrow width and located opposite to a particle generating source and depositing them on the surface of the object, characterized in that the layer of deposition film on the object is controlled to have a thickness less than 400 Å. It should be noted that the term "an object having a narrow width" represents an object having a reduced area of surface on which particles may be deposited. Typical objects having a narrow width are bodies in the form of a mesh such as a photosensitive screen base, an object in the form of a series of bars or the like.

According to the invention, particles of material constituting the thin film structure are deposited on the surface of an object having a narrow width by a specifically defined thickness less than 400 Å. Namely, deposition of particles is achieved on the surface of the object while it is very little affected by any undesirable arrival of particles at the rear side of the object. Thus, a layer of thin film having a required value of resistance can be obtained at all time. Accordingly, the thin film structure thus obtained can be delivered to a next step (for instance, a step of forming a photosensitive layer) without any necessity for additionally processing it. As will be readily apparent, the actual thickness of the thin flim structure of the invention is an important factor. If it is determined to be thicher than 400 Å, undesirable arrival of some of the particles at the rear surface of an object will result.

Other objects, features and advantages of the present invention will become more clearly apparent from a reading of the following description which has been prepared in conjunction with the accompanying drawings.

BRIEF DESCRIPTION OF THE DRAWINGS

The accompanying drawings will be briefly described below.

FIGS. 1 to 4 schematically illustrate a typical example of a conventional electrographic copying machine.

FIG. 1 is a schematic vertical sectional view illustrating the structure of a two-color electrophotographic copying machine;

FIG. 2 is a fragmental sectional view illustrating a part of a photosensitive screen base in an enlarged scale;

FIG. 3 is a fragmental sectional view of the photosensitive screen base illustrating how vaporized particles are deposited on the surface thereof;

FIG. 4 is a fragmental sectional view of the photosensitive screen base after completion of deposition;

FIG. 5 is a fragmental sectional view of the apparatus illustrating that vaporized particles are deposited on the surface of the screen base;

FIG. 6 is an enlarged sectional view illustrating an essential part of the apparatus in FIG. 5;

FIG. 7 is an enlarged sectional view similar to FIG. 6 particularly illustrating the positional relation among the components constituting the apparatus;

FIG. 8 is a graph illustrating how a width of particle dispersion varies in dependence on a distance between the shield plate and the screen base;

FIG. 9 is a sectional view schematically illustrating how the screen base is supported;

FIGS. 10 to 12 and 16 schematically illustrate a modified apparatus respectively.

FIG. 10 is a sectional view of a modified apparatus in which an electron gun is disposed at a position by the side of the passage along which vaporized particles are caused to fly;

FIG. 11 is a schematic view of a modified apparatus in which a coil electrode is disposed at a position in vertical alignment with the passage of flying vaporized particles;

FIG. 12 is a schematic view of a modified apparatus in which an aluminum target is spattered by plasma beam;

FIG. 16 is a schematic view of a modified apparatus in which a spray nozzle for spraying insulating material is disposed in front of the screen base;

DESCRIPTION OF THE PREFERRED EMBODIMENTS

Now, the present invention will be described in a greater detail hereunder with reference to the accompanying drawings which schematically illustrate preferred embodiments thereof.

Description will be first made as to a first embodiment of the invention with reference to FIGS. 5 to 12.

Figure 5:
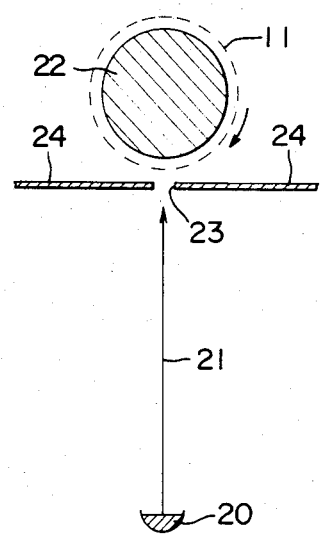
FIGS. 5 to 12 schematically illustrate an apparatus for forming a layer of thin film in accordance with the invention.

FIG. 5 schematically illustrates a method of forming an aluminum deposition film (as identified by reference numeral 14 in the above description) on the photoconductive screen base 11 (the surface or outer surface of which is already coated with an electric insulating layer 13) with the aid of a bell jar (not shown) in which the screen base 11 and the aluminum vapor source 20 are arranged under vacuum atmosphere in the range of $10^{-4}$ to $10^{-5}$ Torr. The screen base 11 is mounted on a mandrel 22 so that they are rotated together at the rotational speed of, for instance, 15 rpm.

Figure 6:
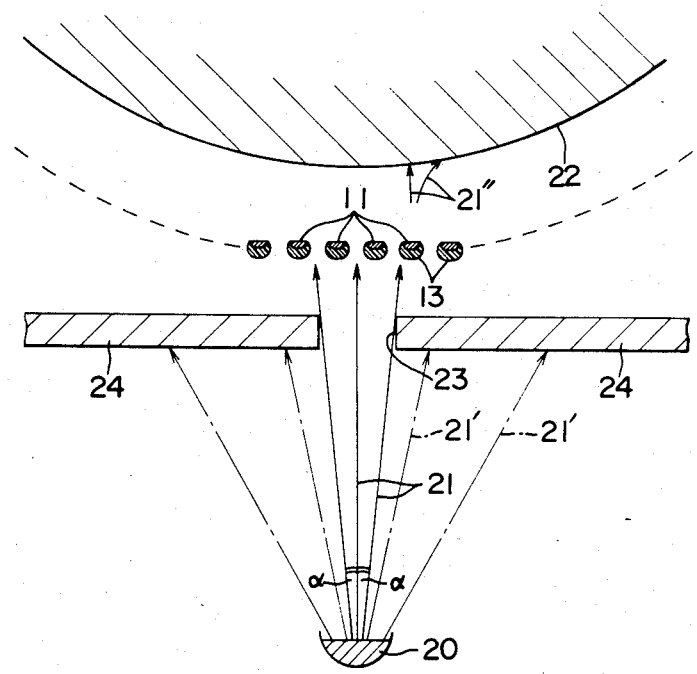

An important thing to be noted is that a shield plate 24 with a slit 23 formed thereon is provided in the area between the screen base 11 and the vapor source 20 at a position in the proximity of the screen base 11. Owing to the arrangement of the shield plate 24 being thus made, a part of the aluminum vapor coming up from the vapor source 20 at a certain inclination angle in the direction identified by chain lines 21' is inhibited from further travel due to the existence of the shield plate 24 and only a part 21 of the alumimum vapor coming up at a right angle relative to the screen base 11 is permitted to pass through the slit 23 whereby it is deposited on the electric insulating layer 13, as illustrated in FIG. 6. The outermost part 21 of the aluminum vapor which can pass through the slit 23 has an angle $\alpha$ relative to the vertical plane from the vapor source which is determined, for instance, as 0.5 degrees. Provided that the slit 23 has a width of 5 mm, a certain number (for instance, 20) of mesh components on the screen base 11 are included within the area of the slit 23.

Since only the vertically extending part 21 of aluminum vapor is selectively introduced onto the screen base 11 via the slit 23 of the shield plate 24 in such a manner as described above, aluminum deposition takes place only on the surface or the outer surface of the screen base 11 without any deposition on the rear surface of the same. Thus, no electric connection is made between the screen base 11 and the layer of aluminum deposition.

To assure that the aluminum deposition film 14 is correctly formed for the purpose of satisfactorily accomplishing the intended objects of the present invention it is preferable to take into account a distance $D_{SM}$ (distance between the shield plate 24 and the screen base 11). Incidentally, a distance $D_{BS}$ (distance between the shield plate 24 and the vapor source 20), a width W (width of the slit 23) and a width d (width of dispersion of aluminum vaporized particles which are divergently displaced in the upward direction away from both the ends of the slit 23) are additionally noted in FIG. 7.

Figure 8:
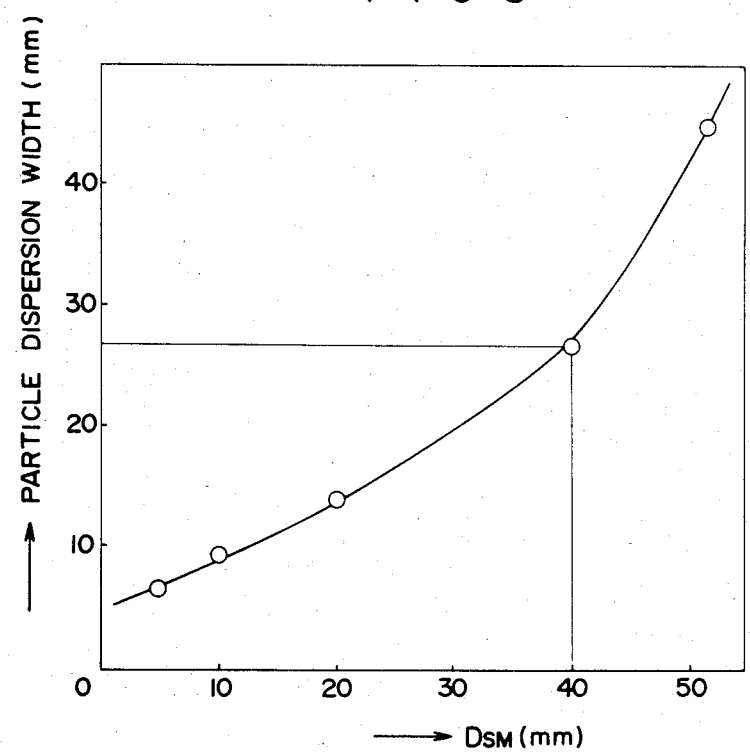

It has been confirmed that the dispersion width d can be minimized by selectively determining the width $D_{SM}$ (distance between the shield plate and the screen case). Namely, it has been found that, as shown in FIG. 8 (where $\Delta_{BS}=300$ mm, W=5 mm, $R_{Al}=1$ g/min), when the distance between the shield plate and the screen base is reduced so that $D_{SM}=40$ mm, the width of dispersion of vaporized particles can be reduced to less than 25 mm and thereby a required aluminum deposition film can be easily obtained.

Next, description will be made below as to the mandrel 22 as mentioned above particularly with reference to FIG. 9.

In practice the mandrel 22 is disposed in the screen base 11 with a close clearance maintained therebetween so that aluminum vaporized particles which pass through the mesh structure are inhibited from moving further due to the existence of the mandrel 22. Thus, deposition of aluminum vaporized particles on the other inner surface of the screen base 11 is effectively prevented. As illustrated in the drawing, the mandrel 22 is integrally fitted with an additional sleeve 25 and rings 26 are firmly mounted on both ends of the sleeve 25 so that the screen base 11 is immovably supported between both the rings 26.

Figure 10:
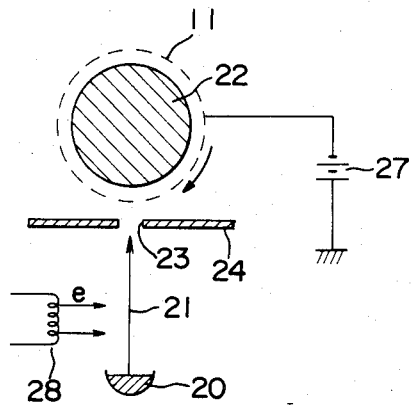

FIG. 10 schematically illustrates a modified vacuum deposition apparatus which is constructed such that bias voltage 27 is applied to the screen base 11 and an electron gun 28 is arranged at a position located at a distance from the passage of vaporized particles 21 emitted from the vapor source 20 so as to activate or ionize them by electrons emitted from the gun. An advantageous feature of the apparatus is that vaporized particles 21 are deposited on the screen base 11 with highly increased efficiency.

Figure 11:
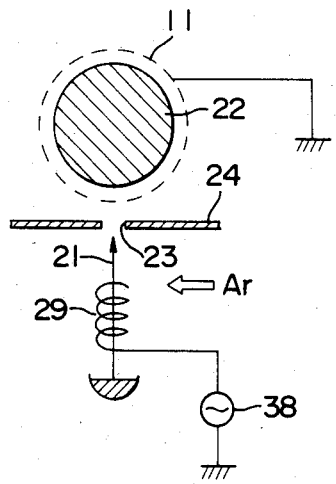
Figure 9:
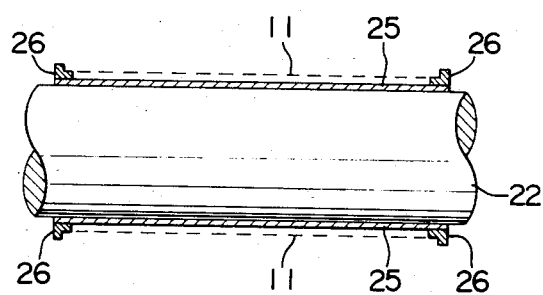

FIG. 11 schematically illustrates another modified vacuum deposition apparatus which is constructed such that a coil electrode 29 is arranged at a position between the shield plate 24 and the vapor source so as to allow high frequency current 38 to flow through the coil electrode 29 and deposition is achieved in accordance with the same principle as in the case of the conventional RF ion plating method while argon gas is introduced into the bell jar.

Figure 12:
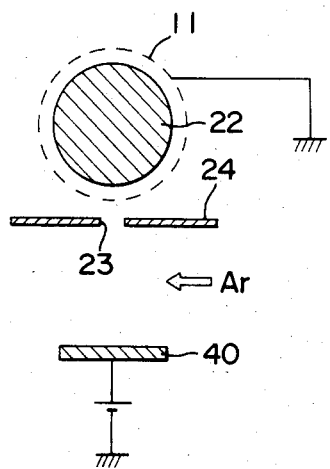

FIG. 12 schematically illustrates another modified vacuum deposition apparatus in which a layer of aluminum film is formed in accordance with the so-called spattering method. Specifically, an aluminum target 40 is spattered by plasma beam which is carried by argon gas and spattered aluminum particles are then displaced upwardly through the slit 23 to reach the screen base at substantially a right angle relative to the latter whereby an aluminum deposition layer 14 having photoconductivity is formed on the screen base 11.

It should be noted that the present invention should not be limited only to the above-described photosensitive screen but it may be employed in a variety of application fields such as production of magnetic recording film (for instance, Co-Cr film) or similar thin film. Further, the present invention should not be limited only to a single shield plate. Alternatively, a plurality of shield plates may be employed in combination. Further, an electric field or a magnetic field may be applied to the passage of vaporized particles in such a manner that the stream of vaporized particles converges on the slit. Moreover, the cross-sectional configuration of the screen base should not be limited only to a circle but other cross-sectional configurations, such as a rectangle or the like, may be employed.

Next, description will be made as to the method in accordance with another embodiment of the invention. In this embodiment the following five conditions are preferably taken into account so as to assure that an aluminum deposition film 14 is produced for the purpose of satisfactorily accomplishing the objects of the invention.

(1) $D_{SM}$ (distance between the shield plate and the screen base 11)
(2) $D_{BS}$ (distance between the vapor source 20 and the shield plate 24)
(3) W (width of the slit)
(4) vaporizing speed of aluminum ($R_{Al}$)
(5) thickness of the aluminum deposition film 14 ($T_{Al}$)

The above-noted conditions will be described in more details with reference to results derived from experiments which were conducted by the inventors.

First, the results as shown in Table 1 were obtained from a number of experiments which were conducted on the assumption that the following conditions were kept constant and the width W of the slit 23 varies.

$D_{SM} = 5$ mm
$D_{BS} = 300$ mm
$R_{Al} = 1$ gram/min rear surfaces of the screen base is maintained higher than 10 million ohms). In any case, good results were obtained when a thicker insulating film was formed.

Next, the results as shown in Table 2 were obtained when a number of experiments were conducted with the following conditions being kept constant.

$D_{SM} = 5$ mm
$D_{BS} = 300$ mm
$W = 10$ mm
$R_{Al} = 1$ gram/min

TABLE 1

| sample No. | width of slit W (mm) | dispersion width* (mm) | number of coatings for insulating layer 13 | thickness of aluminum layer (Å) | resistance between both front and rear surfaces on screen base | resistance on deposition surface of screen base as measured by the following distance (ohm in unit) | | |
|---|---|---|---|---|---|---|---|---|
| | | | | | | 1 cm | 5 cm | 10 cm |
| 1 | 10 | 13 | 4 times (thinner layer) | 205 | higher than 10 million ohms | 100 | 120 | — |
| 2 | 20 | 24 | 4 times (thinner layer) | 172 | higher than 10 million ohms | 70 | 80 | 80 |
| 3 | 30 | 33 | 4 times (thinner layer) | 218 | 200 ohms | 40 | 55 | 70 |
| 4 | 5 | 6.5 | 8 times (thicker layer | 130 | higher than 10 million ohms | 400 | 1000 | — |
| 5 | 10 | 13 | 8 times (thicker layer | 180 | higher than 10 million ohms | 100 | 120 | — |
| 6 | 20 | 24 | 8 times (thicker layer | 171 | higher than 10 million ohms | 120 | 240 | — |
| 7 | 30 | 33 | 8 times (thicker layer | 178 | higher than 10 million ohms | 100 | 130 | — |

Note
*dispersion width: As is apparent from FIG. 7, vaporized aluminum particles tend to be dispersed outwardly of both ends of the slit. The dispersion width represents a width d of the stream of vaporized aluminum particles as measured at the position beneath the screen base.

It is apparent from the results in Table 1 that the dispersion width d is reduced to about 24 mm when the slit has a width W of about 20 mm and any arrival of vaporized aluminum particles at the rear surface of the screen base brings no adverse effect even when a disadvantageously thinner insulating film is formed due to occurrence of the aforesaid arrival of vaporized aluminum particles (because resistance between the front and rear surfaces of the screen base is maintained higher than 10 million ohms).

number of coatings for the electric insulating layer 13 = 4 times (the layer having a thinner thickness)

TABLE 2

| sample No. | thickness of aluminum layer (Å) | resistance between both front and rear surfaces of screen base (ohm in unit) | resistance on deposition surface of screen base as measured by the following distance (ohm in unit) | | | result of withstand voltage test* (in the range of 100 to 120 V) |
|---|---|---|---|---|---|---|
| | | | 1 cm | 5 cm | 10 cm | |
| 8 | 118 | higher than 10 million | 220 | 600 | 900 | no damage recognized |
| 9 | 180 | higher than 10 million | 100 | 120 | — | no damage recognized |
| 10 | 205 | higher than 10 million | 80 | 100 | — | no damage recognized |
| 11 | 325 | 6 to 10 million | 30 | 60 | — | slight damage recognized |
| 12 | 350 | several million | lower than 30 | lower than 60 | 70 | slight damage recognized |
| 13 | 400 | 1 million | lower than 30 | lower than 60 | — | slight damage recognized |
| 14 | 430 | 0.2 million | lower than 30 | lower than 60 | — | some damage recognized |
| 15 | 557 | 60 | 5 | 9 | 12 | remarkable damage recognized |

Note
*This column represents the result of examination which was conducted as to whether or not a layer of aluminum deposition film was damaged by applying a certain voltage thereto.

It is apparent from the results in Table 2 that a sufficiently high value of resistance is obtainable even when a target thickness of aluminum deposition film is predetermined at around 300 Å but leakage of electric current is liable to occur. A thinner layer of aluminum deposition is less affected by undesirable arrival of vaporized aluminum particles at the rear surface of the screen base.

Further, it has been confirmed that a dispersion width d can be minimized by selectively determining the distance $D_{SM}$ (distance between the shield plate and the screen base) whereby travel of vaporized aluminum particles is kept in the form of a parallel stream. As will be apparent from FIG. 8 (which represents the case where $D_{BS}=300$ mm, $W=5$ mm and $R_{Al}=1$ gram/min), a width of dispersion can be reduced to narrower than 25 mm by determining the distance $D_{SM}$ between the screen base and the shield plate to be shorter than 40 mm and thereby a desired layer of aluminum deposition is easily obtained.

Figure 13:
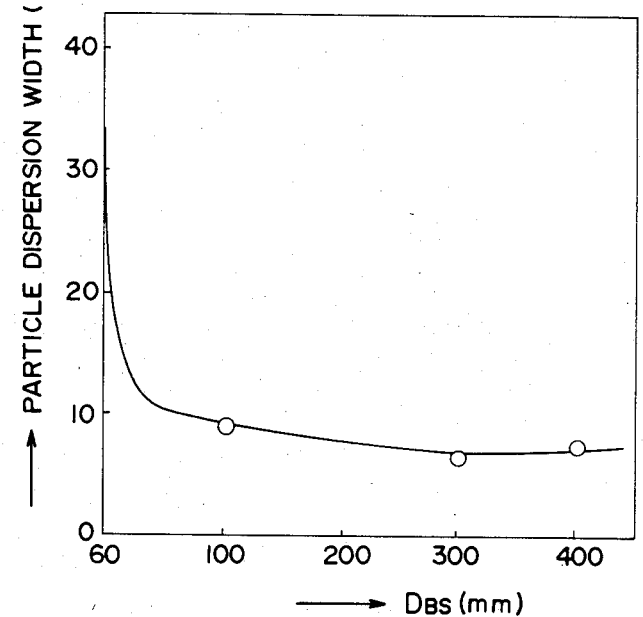
FIG. 13 is a graph illustrating how the width of particle dispersion varies in dependence on the distance between the shield plate and the vapor source which generates vaporized particles.

There is established a relation between the distance $D_{BS}$ and the width d as illustrated in FIG. 13 and it is preferable that the distance $D_{BS}$ is properly determined to be longer than 60 mm (it should be noted that the working conditions as illustrated in FIG. 13 represent $D_{SM}=5$ mm, $W=5$ mm and $R_{Al}=1$ gram/min).

Figure 14:
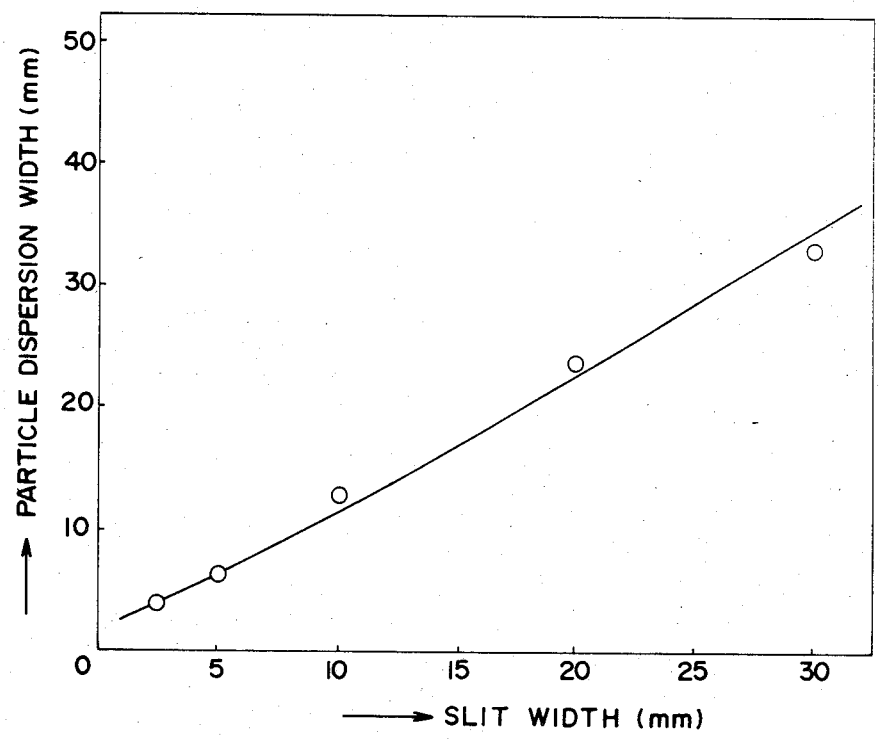
FIG. 14 is a graph illustrating how the width of particle dispersion varies in dependence on the width of the slit.

It is readily apparent from FIG. 14 that the width W should be preferably determined to be shorter than 20 mm so as to reduce the dispersion width d. Further, it is apparent from FIG. 15 that the relation between the slit width W and the dispersion width d varies in dependence on the selected value of the distance $D_{SM}$ and the width of dispersion can be reduced by determining the distance $D_{BS}$ to be not greater than 5 mm (it should be noted that the working conditions as illustrated in the drawing represents $D_{BS}=300$ mm, $D_{SM}=5$ mm or 40 mm, $R_{Al}=1$, 2 or 4 to 6 gram/min).

Figure 15:
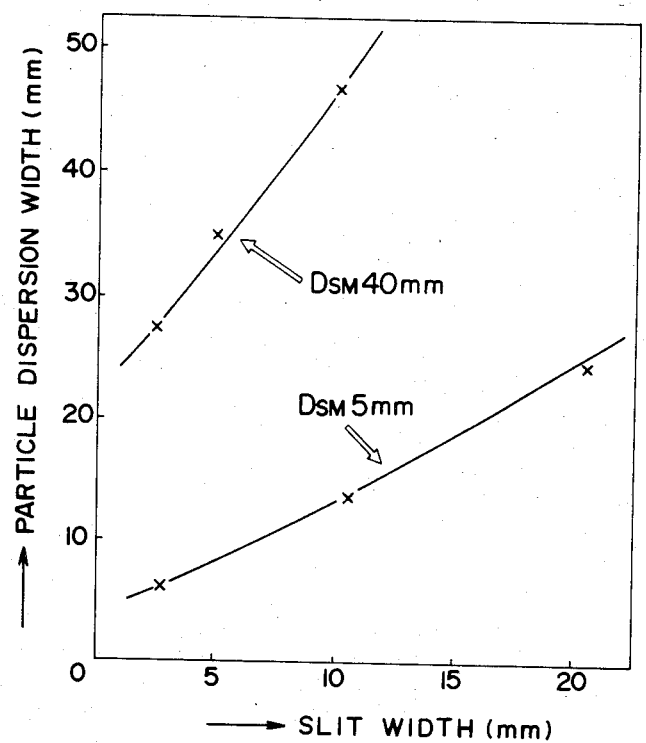
FIG. 15 is a graph illustrating how the width of particle dispersion varies in dependence on the width of the slit while the distance between the shield plate and the screen base is used as a parameter.

The inventor found that it was very important to selectively determine the slit width W as narrow as possible when aluminum vacuum deposition could be achieved with the aid of the shield plate which was arranged in the above-described manner (see FIGS. 14 and 15). Particularly, the slit width W should be preferably determined as less than one-fourth of the diameter R of the screen base 11 (most preferably, the former should be determined as less than one-tenth of the latter). In a concrete case, where R = 120 mm in diameter, it is preferable that the width W is determined to be less than the range of 30 to 12 mm.

As will be readily understood from the above description, the method of the invention makes it possible to form an aluminum deposition film on the surface (outer surface) of the screen case at a high accuracy by using the shield plate to control the stream of vaporized aluminum particles while the width of the shield plate is determined to be as narrow as possible so as to reduce the width of dispersion and thereby keep a large proportion of vaporized aluminum particels with in a parallel stream.

Figure 17:
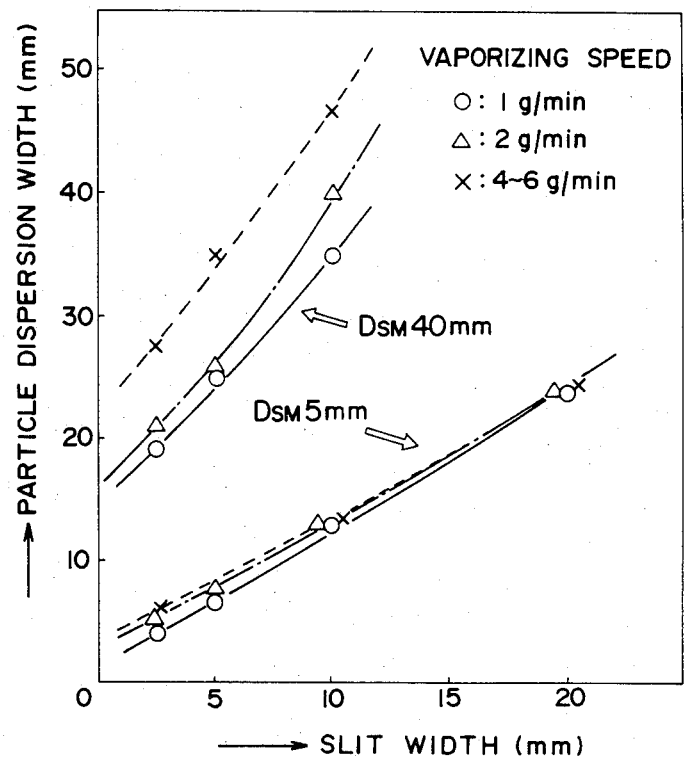
FIG. 17 is a graph illustrating how the width of particle dispersion varies in dependence on the width of the slit while the distance between the shield plate and the screen base is used as a parameter and characteristic curves are plotted at several vaporizing speeds.

Further, it has been found that when aluminum vacuum deposition is achieved in the above-described manner with the aid of the shield plate 24, the dispersion width d (see FIG. 7), that is, the width of deposition of vaporized aluminum particles varies remarkably in dependence on the speed of aluminum vaporizing. As is apparent from FIG. 17, the faster the aluminum vaporizing speed ($R_{Al}$) is, the wider the dispersion width becomes. It is considered that this is attributable to the fact that, as partial pressure of aluminum vapor (number of vaporized aluminum particles) increases, the average distance of their free movement decreases and the amount of vaporized aluminum to be deposited on the screen base located in the vicinity of the shield plate or the width of aluminum deposition increases. IN contrast, when the aluminum vaporizing speed $R_{Al}$ is determined to be lower than 2 grams/min, it results in the distance of free displacement increasing and the width of vaporized aluminum particles to be deposited on the screen base decreasing relatively. The results mentioned above will become particularly remarkable when the distance $D_{SM}$ is determined to be greater.

Figure 18:
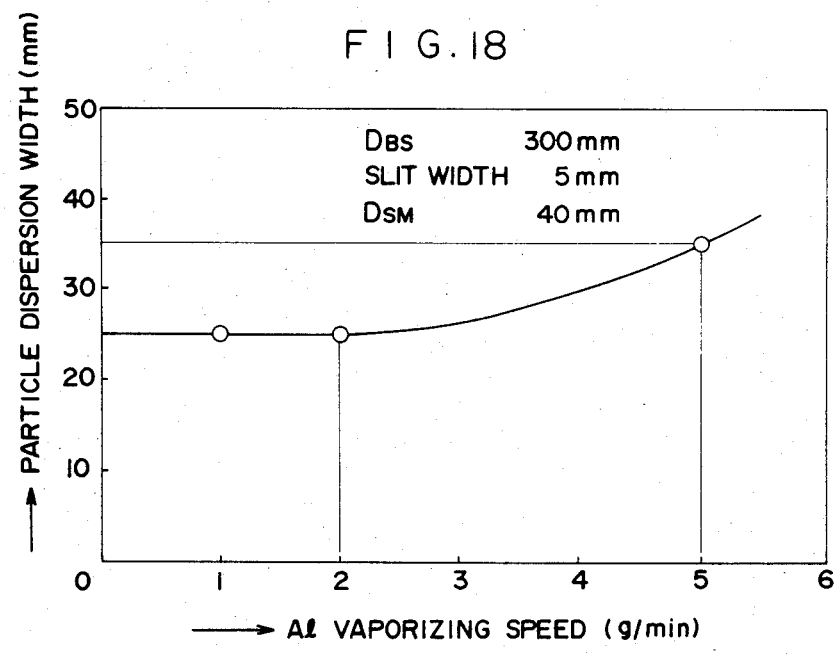
FIG. 18 is a graph illustrating how the width of particle dispersion varies in dependence on aluminum vaporizing speed with some working conditions being kept constant.

The inventor examined how the dispersion width d varies relative to aluminum vaporizing speed and the results illustrated in FIG. 18 were obtained. This examination reveals that the width of dispersion varied in dependence on aluminum vaporizing speed and good results are obtainable when the vaporizing speed is determined to be lower (so as to reduce the volume of vaporization per hour). It is apparent from the drawing that the width of dispersion can be substantially reduced, particularly when aluminum vaporizing speed is determined to be lower than 2 grams/min.

As will be readily understood from the above description, the method of the invention makes it possible to form a layer of aluminum deposition film only on the surface (outer surface) of the screen case by using the shield plate so as to control the stream of vaporized aluminum particles while the speed of aluminum vaporization is determined to be lower to reduce the width of dispersion and thereby keep a large proportion of vaporized aluminum particles within a parallel stream.

Further, it should be noted that by introducing only a confined part 21 of the vaporized aluminum particles (moleculars) onto the surface of the screen base through the slit 23 of the shield plate 24, it is assured that aluminum deposition takes place only on the surface or the outer surface of the screen base 11. As described above, some part of the vaporized aluminum particles may reach the rear side of the screen base after they pass through a large number of mesh pores on the screen base 11. Accordingly, complete prevention of the deposition of some vaporized particles on the rear surface of the screen base cannot be achieved unless a certain countermeasure is taken. In the method of the invention the foregoing problem has been effectively resolved by arrangement of the mandrel 22 in the above-described manner.

Specifically, as illustrated in FIG. 6, vaporized particles 21" which have flown above the rear surface of the screen base come against the mandrel 22 and they are then deposited thereon. Thus, no deposition takes place on the rear surface of the screen base 11 any more. In spite of the fact that some part of the vaporized aluminum particles reach the rear surface of the screen base described above, a large part of them are caused to be deposited on the mandrel and thereby any tendency to cause deposition on the rear surface of the screen base can be reduced considerably.

Figure 16:
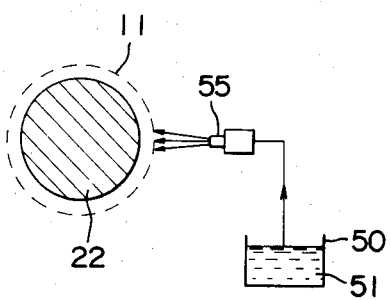

Next, FIG. 16 schematically illustrates an apparatus for forming a layer of thin film made of material other than metallic material, such as aluminum or the like, by using a mandrel. The apparatus is operated in a different manner from each of the foregoing methods.

For instance, electric insulating material 51 in a container 50 is sprayed over the screen base 11 through a spray gun 55 whereby an electric insulating layer 13 as described above is formed. Also, in the illustrated apparatus, the existence of the mandrel 22 contributes to the inhibition of flying particles of insulating material (in practice, a mixture of solvent and insulating material)

being deposited on the rear surface of the screen base 11.

Next, description will be made below as to another embodiment of the present invention.

As described above, by introducing a confined part 21 of vaporized aluminum particles (moleculars) onto the screen base 11, aluminum deposition takes place only on the surface or the outer surface of the screen base 11 while some portion of the vaporized particles are inhibited from reaching the rear surface of the screen base or being deposited directly thereon. It should be noted that some proportion of vaporized particles cannot be prevented from reaching the rear surface of the screen base when the width of the slit 23 is determined incorrectly or when the shield plate 24 is not provided.

Figure 7:
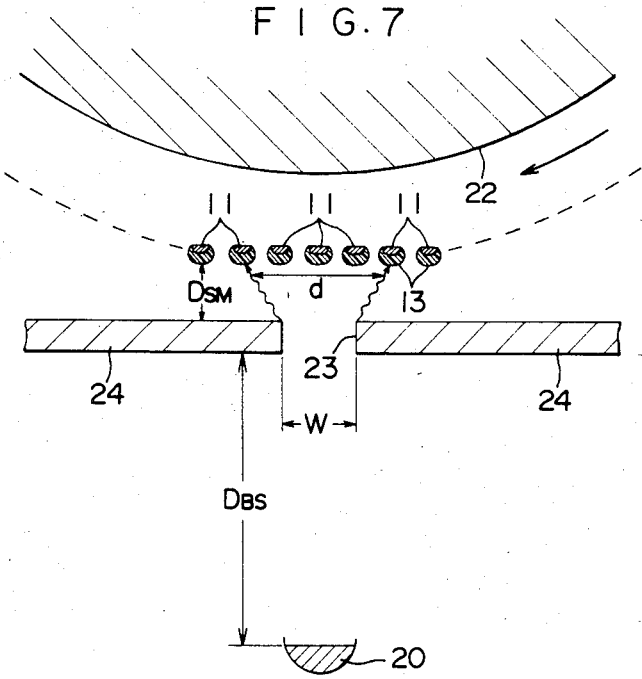

For instance, reference letter d in Fig. 7 is defined as follows.

d = width of dispersion by which vaporized aluminum particles 21 diverge outwardly of both ends of the slit (hereinafter referred to as dispersion width)

The distance $D_{BS}$ is a very important dimension in terms of satisfactorily accomplishing the intended objects of the present invention. As will be apparent from FIG. 13, it is preferable that the distance $D_{BS}$ is properly determined as longer than 60 mm (particularly, longer than 100 mm and, more particularly, longer than 300 mm). (It should be noted that the working conditions as illustrated in FIG. 13 represent the case where $D_{BS} = 5$ mm, $W = 5$ mm and $R_{Al} = 1$ gram/min.)

Figure 3:
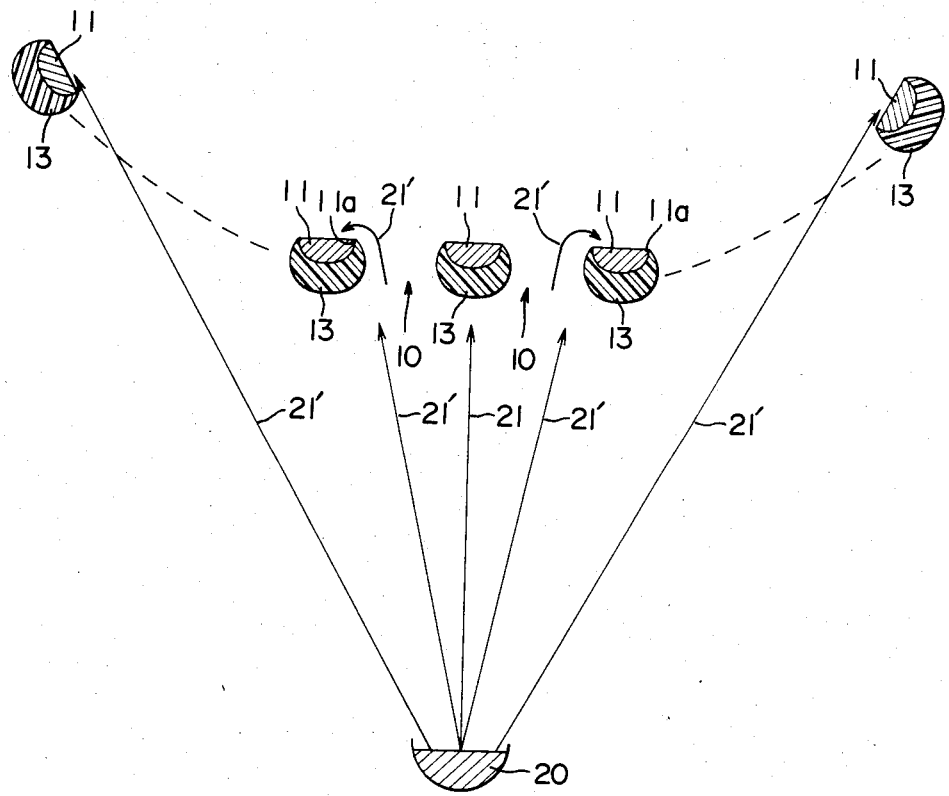
Figure 4:
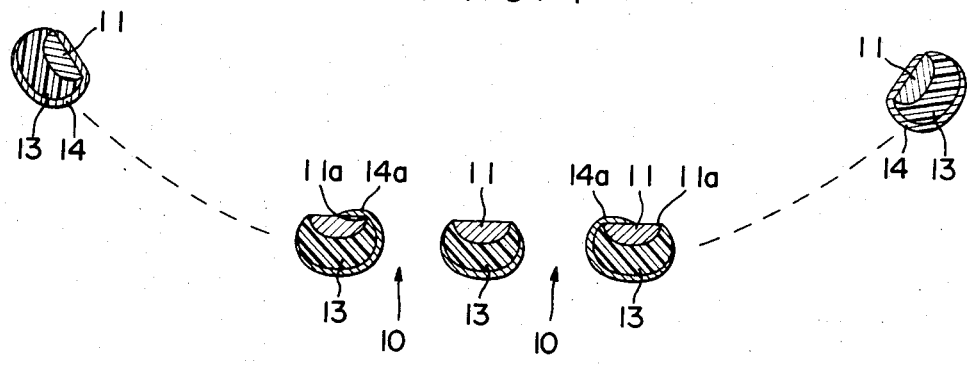

Namely, by determining the distance between the screen base 11 and the vapor source 20 to be sufficiently great in the above-described manner it is assured that the dispersion width d can be reduced and vaporized particles 21 reaching the screen base are kept within a substantially parallel stream. It has been confirmed that this phenomenon occurs also in the case where the shield plate 24 is not provided and vaporized aluminum particles are deposited on the screen base while they are maintained in a substantially parallel stream. Accordingly, in any case, a stream of vaporized particles reaching the screen base 11 are emitted upwardly in the substantially parallel stream whereby some part of the vaporized particles are effectively inhibited from reaching the rear surface of the screen base as illustrated in FIG. 3.

As described above, by introducing a confined part 21 of vaporized aluminum particles (or moleculars) onto the screen base 11 through the slit 23 of the shield plate 24, aluminum deposition takes place only on the surface or the outer surface of the screen base 11 without arrival of some part of the vaporized particles at the rear surface of the screen base 11 or direct deposition on the latter being inhibited, but in some cases, where the width of the slit 23 is determined incorrectly or the shield plate 24 is not provided, some part of the vaporized particles are not successfully inhibited from reaching the rear surface of the screen base.

When the apparatus of the invention was used with the following conditions being kept constant, the results noted in Table 3 were obtained.

$D_{SM}$ (distance between the shield plate 24 and the screen base 11) = 5 mm $D_{BS}$ (distance between the vapor source 20 and the shield plate 24) = 300 mm W (width of the slit 23) = 10 mm $B_{Al}$ (speed of vaporization of aluminum) = 1 gram/min number of coatings of the electric insulating layer 13 = 4 times (the layer having a reduced thickness)

TABLE 3

| sample No. | thickness of aluminum layer (Å) | resistance between both front and rear surfaces of screen base (ohm in unit) | resistance on deposition surface of screen base as measured by the following distance (ohm in unit) | | | result of withstand voltage test* (in the range of 100 to 120 V) |
|---|---|---|---|---|---|---|
| | | | 1 cm | 5 cm | 10 cm | |
| 8 | 118 | higher than 10 million | 220 | 600 | 900 | no damage recognized |
| 9 | 180 | higher than 10 million | 100 | 120 | — | no damage recognized |
| 10 | 205 | higher than 10 million | 80 | 100 | — | no damage recognized |
| 11 | 325 | 6 to 10 million | 30 | 60 | — | slight damage recognized |
| 12 | 350 | several million | lower than 30 | lower than 60 | 70 | slight damage recognized |
| 13 | 400 | 1 million | lower than 30 | lower than 60 | — | slight damage recognized |
| 14 | 430 | 0.2 million | lower than 30 | lower than 60 | — | some damage recognized |
| 15 | 557 | 60 | 5 | 9 | 12 | remarkable damage recognized |

Note
*This column represents the result of examination which was conducted as to whether or not a layer of aluminum deposition film was damaged by applying a certain voltage thereto.

It will be apparent from the results on Table 3 that leakage of electric current is liable to occur when a layer of aluminum deposition has a thickness greater than 500 Å. A layer of aluminum deposition having a reduced thickness will be less affected by undesirable arrival of some proportion of the vaporized aluminum particles at the rear surface of the screen base.

An actual working state is schematically illustrated in FIG. 7. When the layer of aluminum deposition has a thickness of 500 Å, a part of the vaporized aluminum particles reach the rear surface of the screen base and they are then deposited thereon, resulting in the occurrence of short circuiting between the aluminum deposition film and the screen base. On the other hand, when the layer of aluminum deposition has a thickness in the range of 200 to 400 Å, the above-mentioned phenomenon does not occur. Further, it has been confirmed that a remarkably good result is obtainable particularly when it has a thickness in the range of 200 to 250 Å.

While the present invention has been described above with respect to a few preferred embodiments thereof, it should of course be understood that the present invention should not be limited to them only but various changes or modifications may be made in any acceptable manner without any departure from the spirit and scope of the invention.

What is claimed is:

1. A method of forming a thin layer on a substrate having a multiplicity of mesh-like holes by means of vapor deposition, characterized in that shield means with a slit is provided in the proximity of said substrate and particles of a material constituting said thin layer are caused to fly through said slit in such a direction that they reach the surface of said substrate at substantially a right angle.

2. The method according to claim 1, wherein said slit is formed so that the width thereof is substantially smaller than the distance between said shield means and a vapor source container.

3. The method according to claim 1, wherein means for preventing unnecessary deposition on the rear side of the substrate is provided in the rear proximity of the substrate with respect to said shield means.

4. The method according to claim 1, wherein said substrate is a cylindrical drum.

5. The method according to claim 3, wherein said substrate is cylindrical in shape.

6. The method according to claim 5, wherein said preventing means is a mandrel.

7. The method according to claim 6, wherein said substrate is of electroconductive.

8. The method according to claim 7, wherein said material is aluminum.

9. The method according to claim 7, wherein said material is a photoconductive material.

* * * * *